(12) United States Patent
Kumazawa

(10) Patent No.: US 12,510,582 B2
(45) Date of Patent: Dec. 30, 2025

(54) SEMICONDUCTOR DEVICE

(71) Applicant: FUJI ELECTRIC CO., LTD., Kawasaki (JP)

(72) Inventor: Yuki Kumazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 225 days.

(21) Appl. No.: 18/453,536

(22) Filed: Aug. 22, 2023

(65) Prior Publication Data
US 2024/0142511 A1 May 2, 2024

(30) Foreign Application Priority Data

Oct. 26, 2022 (JP) .................................. 2022-171162

(51) Int. Cl.
*G01R 31/26* (2020.01)
*G01R 31/27* (2006.01)
*H03K 17/687* (2006.01)

(52) U.S. Cl.
CPC ......... *G01R 31/2619* (2013.01); *G01R 31/27* (2013.01); *H03K 17/6871* (2013.01)

(58) Field of Classification Search
None
See application file for complete search history.

(56) References Cited

U.S. PATENT DOCUMENTS

| | | | | |
|---|---|---|---|---|
| 2009/0108863 | A1* | 4/2009 | Gonzalez | G01R 31/2837 324/750.3 |
| 2016/0216315 | A1* | 7/2016 | Jung | G01R 31/2882 |
| 2019/0356128 | A1 | 11/2019 | Shimizu | |
| 2021/0396714 | A1* | 12/2021 | Khan | G01N 29/48 |
| 2022/0059419 | A1 | 2/2022 | Kurosawa | |
| 2023/0052235 | A1 | 2/2023 | Wada | |
| 2023/0378951 | A1* | 11/2023 | Kumazawa | H03K 17/28 |
| 2024/0014813 | A1* | 1/2024 | Kumazawa | H02M 1/44 |
| 2024/0272662 | A1* | 8/2024 | Fujii | H03K 17/08 |

FOREIGN PATENT DOCUMENTS

| | | | | |
|---|---|---|---|---|
| CN | 111630401 | A * | 9/2020 | G01R 31/26 |
| JP | 2009022084 | A | 1/2009 | |
| JP | 2019201523 | A | 11/2019 | |
| JP | 2022036633 | A | 3/2022 | |
| WO | 2005038919 | A1 | 4/2005 | |
| WO | 2021176695 | A1 | 9/2021 | |

OTHER PUBLICATIONS

English translation of CN 111630401 A (Year: 2020).*

* cited by examiner

*Primary Examiner* — Jermele M Hollington
(74) *Attorney, Agent, or Firm* — Rabin & Berdo, P.C.

(57) ABSTRACT

A semiconductor device, including: a power semiconductor element having a current output electrode; a wire bonded to the current output electrode; and a degradation detection circuit configured to monitor a temporal change of a voltage value of the wire while a constant current flows through the wire, responsive to satisfaction of a plurality of conditions including that the power semiconductor element is in a turn-off state, and that a temperature of the power semiconductor element is within a predetermined temperature range.

8 Claims, 13 Drawing Sheets

SEMICONDUCTOR DEVICE

CROSS-REFERENCE TO RELATED APPLICATION

This application is based upon and claims the benefit of priority of the prior Japanese Patent Application No. 2022-171162, filed on Oct. 26, 2022, the entire contents of which are incorporated herein by reference.

BACKGROUND OF THE INVENTION

1. Field of the Invention

The embodiment discussed herein relates to a semiconductor device with a power semiconductor element.

2. Background of the Related Art

Semiconductor devices that use power semiconductor elements such as insulated gate bipolar transistors (IGBTs) are utilized in power conversion devices such as three-phase inverters that supply power to loads such as motors, for example. Such semiconductor devices are subject to degradation over operating time (operating cycles). Therefore, it is important to prevent failures of the semiconductor devices that may occur due to the degradation.

As related art, for example, there has been proposed a technique that calculates power cycle life while receiving a chip overheat warning signal or a case overheat warning signal, and stops the switching operation of a power semiconductor element when the power cycle life has reached a predetermined value (Japanese Laid-open Patent Publication No. 2019-201523). Further, there has been proposed a technique that detects the degradation state of a joint portion by monitoring the gate voltage and collector-emitter voltage of an IGBT in ON state (International Publication Pamphlet No. WO 2005/038919).

Still further, there has been proposed a technique that detects degradation at a joint portion of a semiconductor element to which a direct current voltage is applied, on the basis of the gate voltage of the semiconductor element and a voltage applied between main electrode terminals thereof (Japanese Laid-open Patent Publication No. 2022-36633). Still further, there has been proposed a technique that applies an on-pulse to semiconductor elements connected in series and detects a voltage drop in the wiring during the on-pulse period (Japanese Laid-open Patent Publication No. 2009-22084).

FIG. 13 illustrates an example of a cross-sectional structure of a semiconductor device. The semiconductor device 100 includes a power semiconductor element 1a and an insulated substrate 50, which are mounted on a base plate 5. The insulated substrate 50 includes a ceramic 51 and patterns 52, 53a, 53b, and 53c. These patterns 52, 53a, 53b, and 53c are made of a copper foil, for example.

The patterns 52, 53a, 53b, and 53c are directly bonded to the ceramic 51. The pattern 52 is bonded to the base plate 5 via solder 6a. In addition, the power semiconductor element 1a is bonded to the pattern 53b via solder 6b.

Wires w1 and w2 are aluminum wires, for example. The wire w1 joins the electrode of the power semiconductor element 1a and the pattern 53c serving as the lead electrode of the insulated substrate 50. The wire w2 joins the pattern 53a and a terminal 7a provided on a terminal case 8. For example, the wires w1 and w2 are bonded by using ultrasonic waves and pressure. In addition, the pattern 53c is bonded to a terminal 7b via solder 6c.

The insulated substrate 50 having the power semiconductor element 1a bonded thereto is housed in the terminal case 8, and the space surrounded by the terminal case 8 and base plate 5 is filled with and sealed by an encapsulating resin, not illustrated. The terminal case 8 and base plate 5 are fixed together with an adhesive or the like.

As the operating time of the semiconductor device 100 configured as above increases, materials expand and contract with temperature changes, which may cause cracks cr at the joint portion between the power semiconductor element 1a and the wire w1 due to a difference in linear expansion coefficient.

As the cracks cr extend with an increase in the operating time of the semiconductor device 100, degradation such as lift-off of the wire w1 progresses, which results in a failure of the semiconductor device 100. To avoid this, a technique is desired that is able to detect the degradation with high accuracy in order to prevent a failure of the semiconductor device that may occur due to the degradation.

SUMMARY OF THE INVENTION

According to one aspect, there is provided a semiconductor device, including: a power semiconductor element having a current output electrode; a wire bonded to the current output electrode; and a degradation detection circuit configured to monitor a temporal change of a voltage value of the wire while a constant current flows through the wire, responsive to satisfaction of a plurality of conditions including that the power semiconductor element is in a turn-off state, and that a temperature of the power semiconductor element is within a predetermined temperature range.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
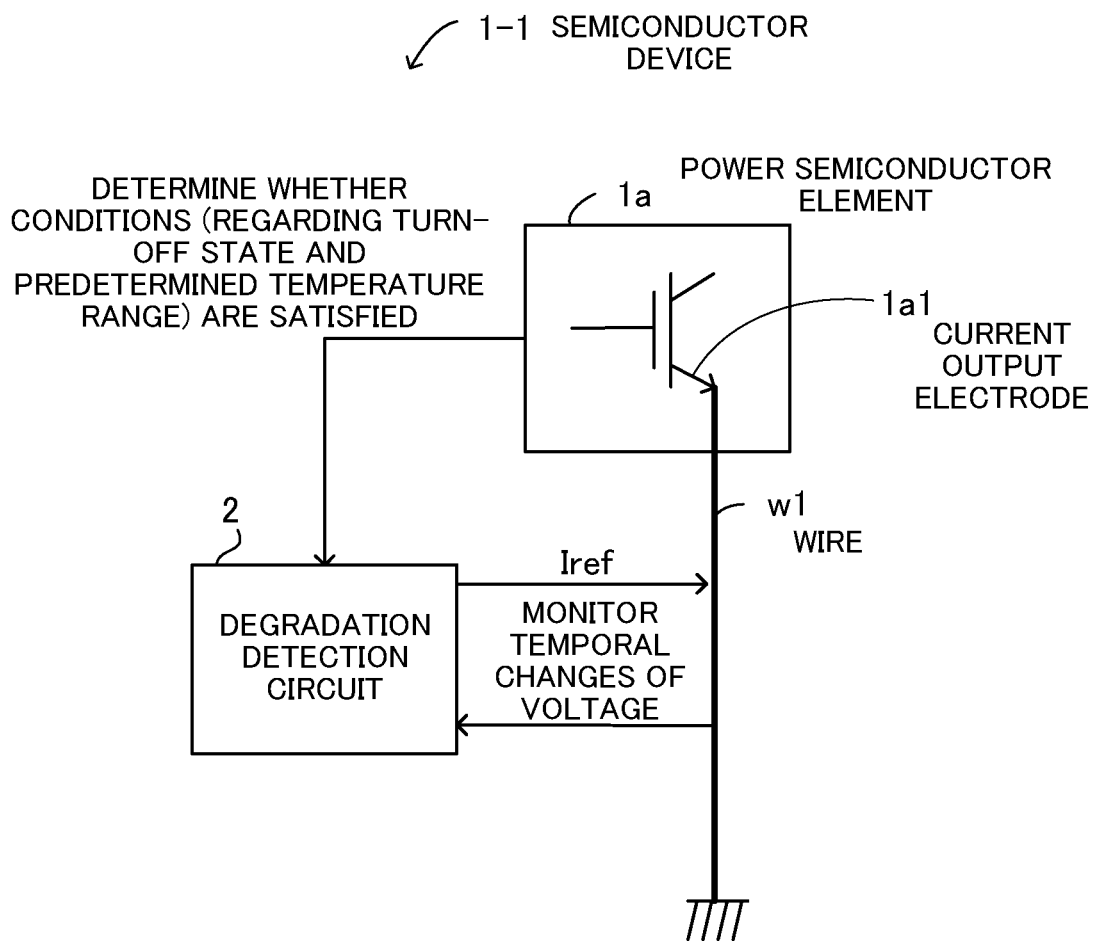
FIG. 1 is a view for describing an example of a semiconductor device.

Hereinafter, one embodiment will be described with reference to the accompanying drawings. In the specification and drawings, elements having substantially the same configuration may be given the same reference numeral, and the overlapping description will be omitted.

FIG. 1 is a view for describing an example of a semiconductor device. The semiconductor device 1-1 includes a power semiconductor element 1a, a wire w1, and a degradation detection circuit 2. One end of the wire w1 is bonded to a current output electrode 1a1 of the power semiconductor element 1a, and the other end thereof is connected to the ground (GND).

In this connection, the power semiconductor element 1a is an integrated gate bipolar transistor (IGBT), for example. In the case of the IGBT, the current output electrode 1a1 corresponds to the emitter of the IGBT. Alternatively, a power metal-oxide-semiconductor field-effect transistor (MOSFET) may be used as the power semiconductor element 1a. In the case of the power MOSFET, the current output electrode 1a1 corresponds to the source of the power MOSFET.

In the case where the power semiconductor element 1a satisfies the conditions in which the power semiconductor element 1a is in turn-off state and the temperature of the power semiconductor element 1a is within a predetermined temperature range, the degradation detection circuit 2 supplies a constant current Iref to the wire w1, and monitor temporal changes of the voltage on the wire w1 to detect degradation. The semiconductor device 1-1 configured as above is able to detect degradation in the joint portion between the power semiconductor element 1a and the wire w1 and thus to prevent the occurrence of a failure.

The following describes a specific configuration and operation of the semiconductor device 1-1 in detail. In the following description, it is assumed that the power semiconductor element 1a is an IGBT and is referred to as an IGBT 1a.

Figure 2:
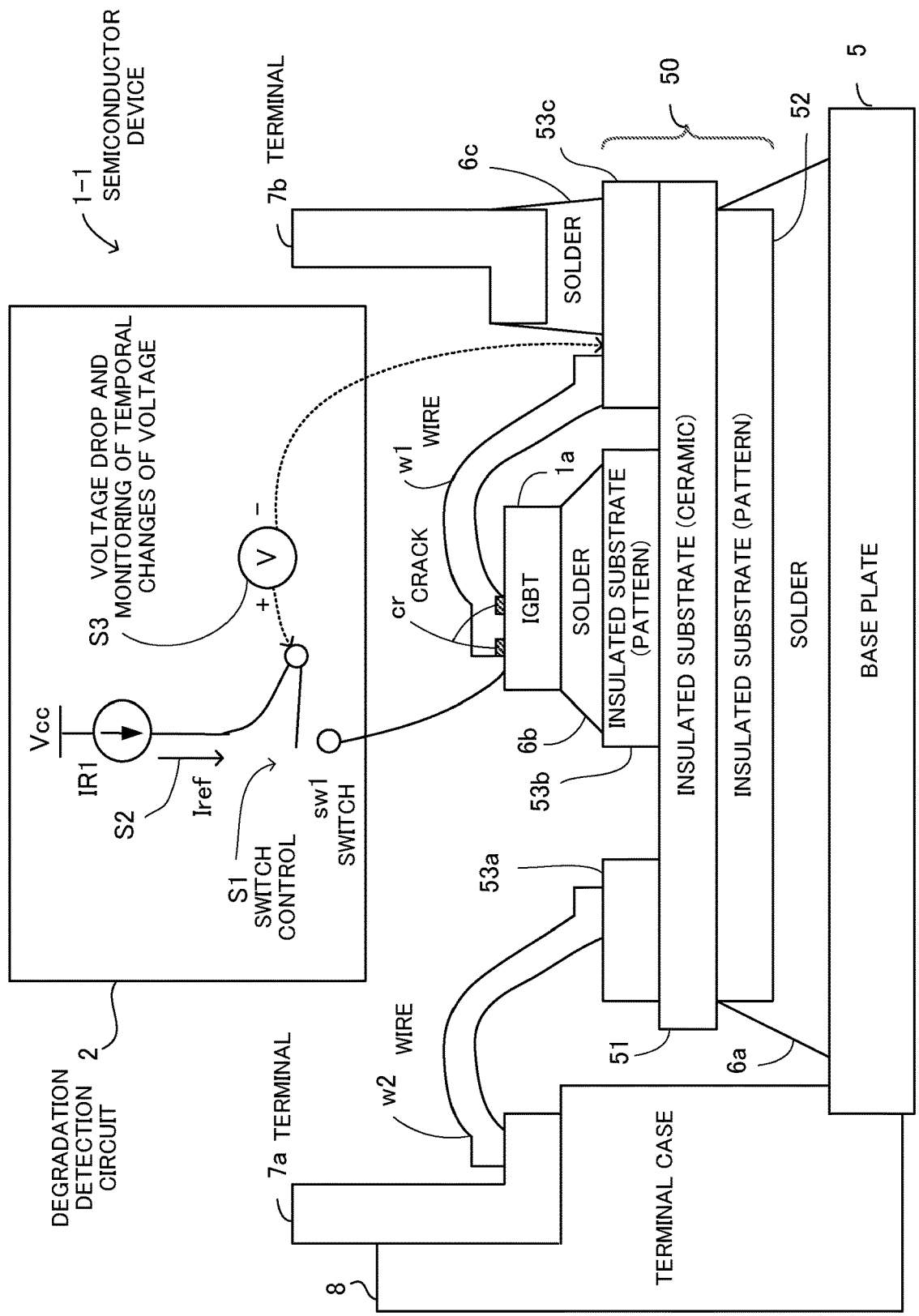
FIG. 2 is a view for describing degradation detection control for the semiconductor device.

FIG. 2 is a view for describing degradation detection control for the semiconductor device. The degradation detection circuit 2 includes a constant current source IR1 and a switch sw1.

(Step S1) The switch sw1 is turned on in the situation where the IGBT 1a is in turn-off state and the temperature of the IGBT 1a is within a predetermined temperature range.

(Step S2) The constant current Iref output from the constant current source IR1 flows through the wire w1.

(Step S3) A voltage drop based on the constant current Iref and the resistance value of the joint portion between the emitter of the IGBT 1a and the wire w1 occurs in the wire w1. The degradation detection circuit 2 monitors the temporal changes of the voltage occurring at this time, and detects degradation in the joint portion between the emitter of the IGBT 1a and the wire w1.

Figure 3:
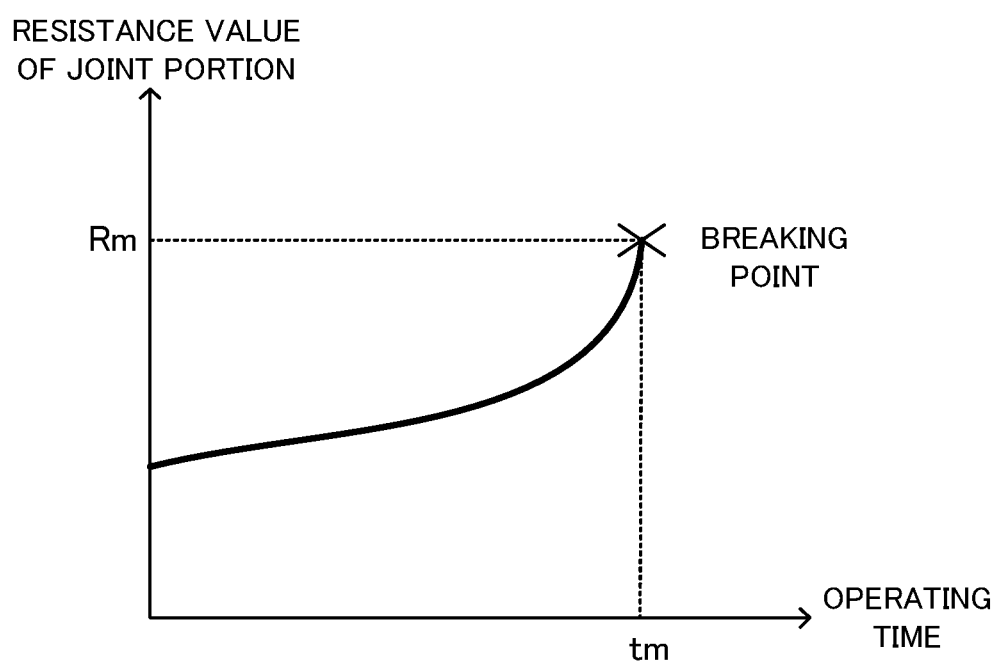
FIG. 3 illustrates the relationship between the operating time of an insulated gate bipolar transistor (IGBT) and the resistance value of a joint portion.

FIG. 3 illustrates the relationship between the operating time of an IGBT and the resistance value of a joint portion. The horizontal axis represents the operating time of the IGBT 1a, whereas the vertical axis represents the resistance value of the joint portion between the emitter of the IGBT 1a and the wire w1.

It is seen from FIG. 3 that the resistance value of the joint portion between the emitter of the IGBT 1a and the wire w1 increases as the operating time of the IGBT 1a increases. Note that, when the operating time of the IGBT 1a has reached an operating time tm and the resistance value of the joint portion between the emitter of the IGBT 1a and the wire w1 has increased and reached a resistance value Rm, a breakage such as lift-off of the wire w1 occurs.

Focusing on the increase in the resistance value with the increase in the operating time of the IGBT 1a, the present embodiment is designed to detect degradation in the joint portion between the emitter of the IGBT 1a and the wire w1. More specifically, in the situation where the IGBT 1a satisfies predetermined conditions (in which the IGBT 1a is in turn-off state and the temperature of the IGBT 1a is within a predetermined temperature range), the degradation detection circuit 2 supplies a constant current to the wire w1, and detects degradation by monitoring temporal changes of the voltage on the wire w1 that occur with the increase in the resistance value of the joint portion between the emitter of the IGBT 1a and the wire w1.

Figure 4:
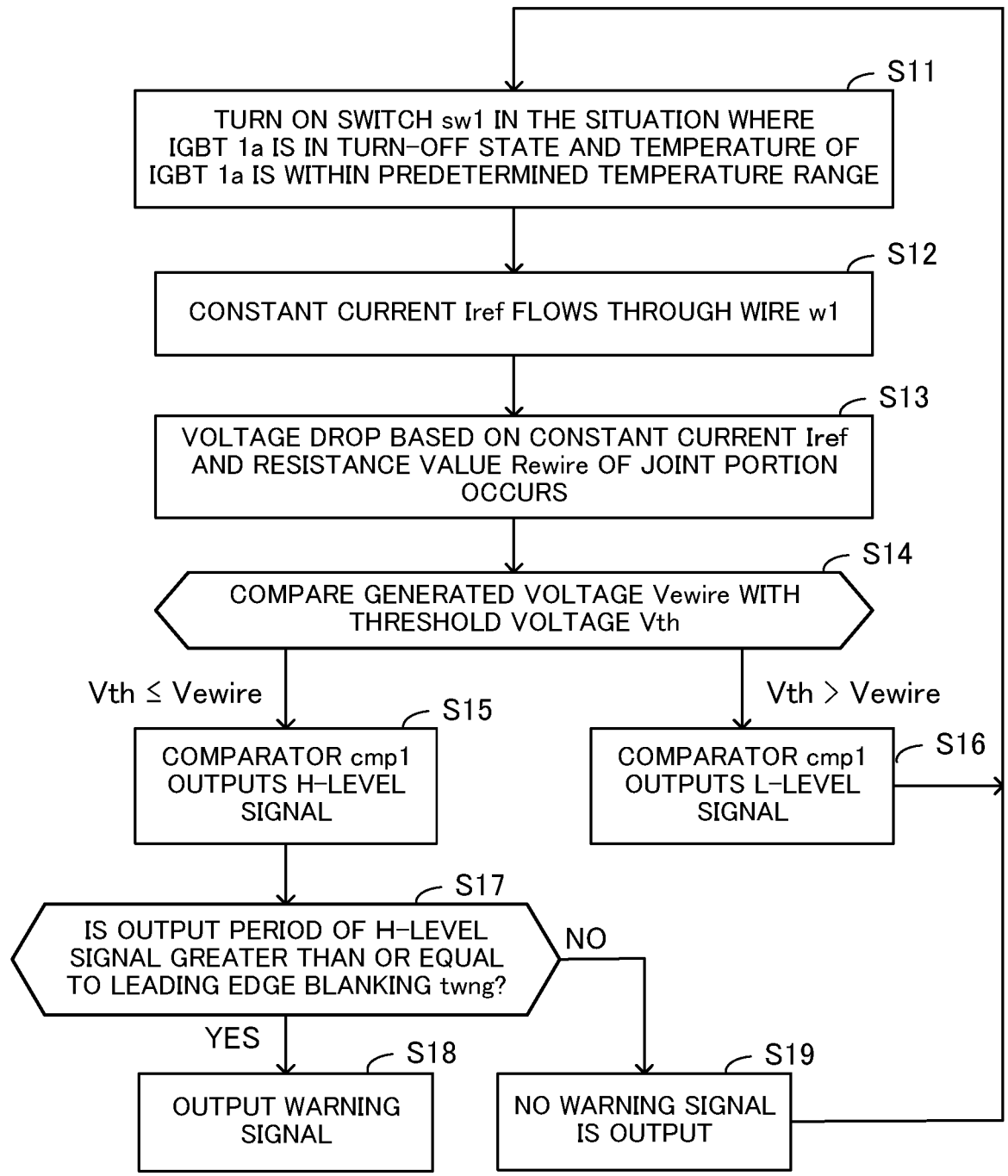
FIG. 4 is a flowchart illustrating a flow of control of a degradation detection circuit.

FIG. 4 is a flowchart illustrating a flow of control of a degradation detection circuit.

(Step S11) The degradation detection circuit 2 turns on the switch sw1 in the situation where the IGBT 1a is in turn-off state and the temperature of the IGBT 1a is within a predetermined temperature range.

(Step S12) The constant current Iref output from the constant current source IR1 flows through the wire w1.

(Step S13) A voltage drop based on the constant current Iref and the resistance value Rewire of the joint portion between the emitter of the IGBT 1a and the wire w1 occurs in the wire w1.

(Step S14) The degradation detection circuit 2 compares the voltage Vewire (=Iref×Rewrire) generated at step S13 with a threshold voltage Vth. The control proceeds to step S15 if the voltage Vewire is greater than or equal to the threshold voltage Vth. The control proceeds to step S16 if the voltage Vewire is less than the threshold voltage Vth.

(Step S15) A comparator cmp1 in the degradation detection circuit 2 outputs an H-level signal.

(Step S16) The comparator cmp1 in the degradation detection circuit 2 outputs an L-level signal. This state indicates that the degradation has not progressed to a dangerous level at which a failure would occur. The control returns back to step S11.

(Step S17) The degradation detection circuit 2 determines whether the output period of the H-level signal from the comparator cmp1 is greater than or equal to a leading edge blanking twng. The control proceeds to step S18 if the output period of the H-level signal is greater than or equal to the leading edge blanking twng. The control proceeds to step S19 if the output period of the H-level signal is less than the leading edge blanking twng.

In this connection, this leading edge blanking twng is set so as to prevent the situation where the voltage Vewire temporarily exceeds the threshold voltage Vth of the comparator cmp1 due to noise or the like and a degradation warning signal is then erroneously output.

(Step S18) The degradation detection circuit 2 recognizes that the degradation has progressed to the dangerous level at which a failure would occur, and therefore outputs the degradation warning signal to make a notification to the outside that the degradation has progressed to the dangerous level at which a failure would occur in the semiconductor device 1-1.

(Step S19) The degradation detection circuit 2 recognizes that the voltage Vewire temporarily exceeds the threshold voltage Vth of the comparator cmp1 due to noise or the like, and therefore does not output the degradation waring signal. The control returns back to step S11.

Figure 5:
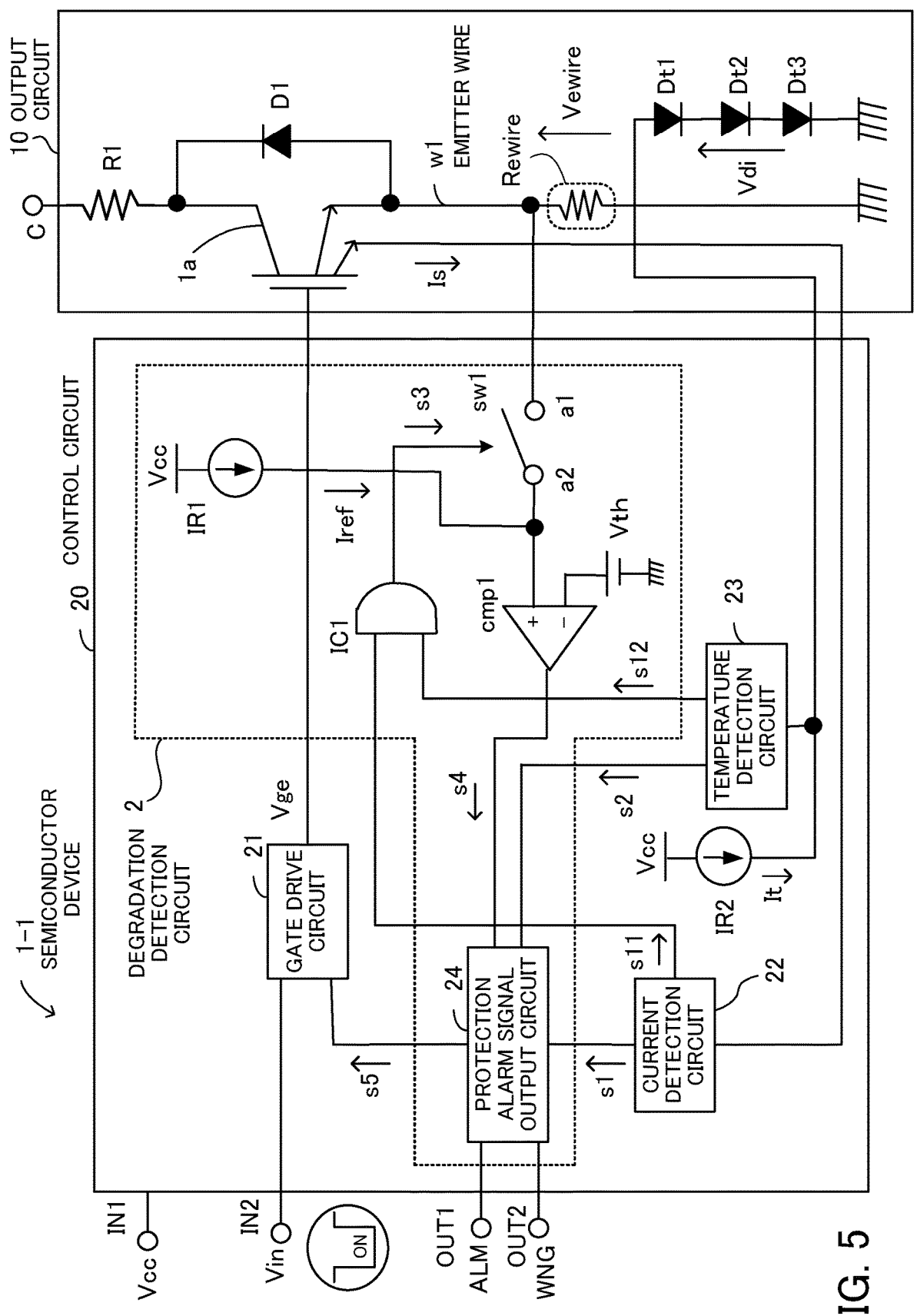
FIG. 5 illustrates an example of the configuration of the semiconductor device.

FIG. 5 illustrates an example of the configuration of the semiconductor device. The semiconductor device 1-1 includes an output circuit 10 and a control circuit 20. The output circuit 10 includes the IGBT 1a, a diode D1, temperature detection diodes Dt1, Dt2, and Dt3, a resistor R1, and the wire w1 (hereinafter, may be referred to as an emitter wire w1).

The control circuit 20 includes the degradation detection circuit 2, a gate drive circuit 21, a current detection circuit 22, a temperature detection circuit 23, and a temperature detection-dedicated constant current source IR2. The degradation detection circuit 2 includes the constant current source IR1, a logic circuit IC1, the switch sw1, the comparator cmp1, and a protection alarm signal output circuit 24.

The output circuit 10 is provided with a collector terminal C that supplies a voltage signal to the IGBT 1a. The control circuit 20 is provided with a power supply terminal IN1, a control terminal IN2, an output terminal OUT1, and an output terminal OUT2.

A power supply voltage Vcc is applied to the power supply terminal IN1. A gate drive signal Vin of switching and driving the IGBT 1a is input to the control terminal IN2. An alarm signal ALM of making a notification of an overcurrent state and overheat state of the IGBT 1a is output from the output terminal OUT1.

A degradation warning signal WNG of making a notification of degradation in the joint portion between the emitter of the IGBT 1a and the emitter wire w1 is output from the output terminal OUT2.

In the output circuit 10, one end of the resistor R1 is connected to the collector terminal C, and the other end thereof is connected to the collector of the IGBT 1a and the cathode of the diode D1. In this connection, the diode D1 connected in inverse parallel to the IGBT 1a has a function as a free-wheeling diode (FWD).

The emitter of the IGBT 1a is connected to the anode of the diode D1 and one end of the emitter wire w1, and the other end of the emitter wire w1 is connected to GND. In this connection, a resistor Rewire in FIG. 5 represents an equivalent resistance component in the vicinity of the joint portion between the emitter of the IGBT 1a and the emitter wire w1.

With respect to the temperature detection diodes Dt1, Dt2, and Dt3 that are connected in multiple stages, the anode of the temperature detection diode Dt1 is connected to the output terminal of the temperature detection-dedicated constant current source IR2 and the input terminal of the temperature detection circuit 23.

The cathode of the temperature detection diode Dt1 is connected to the anode of the temperature detection diode Dt2. The cathode of the temperature detection diode Dt2 is connected to the anode of the temperature detection diode Dt3, and the cathode of the temperature detection diode Dt3 is connected to GND.

In the control circuit 20, the gate drive circuit 21 receives the gate drive signal Vin via the control terminal IN2 and generates a gate voltage Vge to drive the IGBT 1a. For example, the gate drive signal Vin is sent from a microcomputer. The gate drive circuit 21 then outputs the gate voltage Vge to the gate of the IGBT 1a, and switches (turns on or off) the IGBT 1a on the basis of the level of the gate voltage Vge. For example, if the gate drive signal Vin is L level, the gate drive circuit 21 outputs the H-level gate voltage Vge greater than or equal to the threshold level of the IGBT 1a to turn on the IGBT 1a. If the gate drive signal Vin is H level, the gate drive circuit 21 outputs the L-level gate voltage Vge less than the threshold level of the IGBT 1a to turn off the IGBT 1a.

The current detection circuit 22 monitors a sense current Is output from the sense emitter of the IGBT 1a. Then, the current detection circuit 22 converts the sense current Is to a sense voltage signal, compares the sense voltage signal with a reference voltage, and detects based on the comparison result whether the current state of the IGBT 1a is an overcurrent state.

When detecting that the current state of the IGBT 1a is the overcurrent state, the current detection circuit 22 outputs an overcurrent detection signal s1. In addition, when detecting that the value of the sense current Is is approximately close to 0 A as a result of monitoring the sense current Is, the current detection circuit 22 outputs a current non-detection signal s11 (H level). In this connection, the overcurrent detection signal s1 is input to the protection alarm signal output circuit 24, whereas the current non-detection signal s11 is input to one input terminal of the logic circuit Id1.

A current It output from the temperature detection-dedicated constant current source IR2 flows through the temperature detection diodes Dt1, Dt2, and Dt3. At this time, the potential at the temperature detection diodes Dt1, Dt2, and Dt3 is applied to the temperature detection circuit 23 as a temperature detection voltage Vdi indicating the temperature state of the IGBT 1a.

The temperature detection circuit 23 monitors the temperature of the IGBT 1a. The temperature detection circuit 23 compares the temperature detection voltage Vdi with a reference voltage, and determines based on the comparison result whether the temperature state of the IGBT 1a is an overheat state.

When detecting that the temperature state of the IGBT 1a is the overheat state, the temperature detection circuit 23 outputs an overheat detection signal s2. In addition, when determining that the temperature of the IGBT 1a is within the predetermined temperature range while monitoring the temperature of the IGBT 1a, the temperature detection circuit 23 outputs a normal temperature detection signal s12 (H level). The predetermined temperature range may be set to 25±5° C., for example. In this connection, the overheat detection signal s2 is input to the protection alarm signal output circuit 24, whereas the normal temperature detection signal s12 is input to the other input terminal of the logic circuit IC1.

The logic circuit IC1 in the degradation detection circuit 2 is an AND element with two inputs and one output. The one input terminal of the logic circuit IC1 is connected to the output terminal of the current detection circuit 22 that outputs the current non-detection signal s11, and the other input terminal of the logic circuit IC1 is connected to the output terminal of the temperature detection circuit 23 that outputs the normal temperature detection signal s12.

In addition, the output terminal of the logic circuit IC1 is connected to a switch control terminal of the switch sw1. A terminal a1 of the switch sw1 is connected to the emitter wire w1, and a terminal a2 of the switch sw1 is connected to the non-inverting input terminal (+) of the comparator cmp1. A threshold voltage Vth is input to the inverting input terminal (−) of the comparator cmp1. Then, a signal output from the comparator cmp1 is input to the protection alarm signal output circuit 24.

Here, when receiving the H-level current non-detection signal s11 and the H-level normal temperature detection signal s12, the logic circuit IC1 outputs an H-level signal (a signal of a predetermined level) s3. The output of the H level signal s3 from the logic circuit IC1 indicates that the IGBT 1a is in turn-off state and the temperature of the IGBT 1a is within the predetermined temperature range.

Note that, when the logic circuit IC1 does not receive at least one of the current non-detection signal s11 and the normal temperature detection signal s12 (that is, an L level at at least one of the two inputs), the logic circuit Id1 outputs L level.

The switch sw1 is turned on when the H-level signal s3 is input to the switch control terminal. Note that the switch sw1 is in off state when the L level is input to the switch control terminal. When the switch sw1 is turned on, the output terminal of the constant current source IR1 and the non-inverting input terminal (+) of the comparator cmp1 are connected to the emitter wire w1.

When the output terminal of the constant current source IR1 is connected to the emitter wire w1, the constant current Iref flows through the emitter wire w1. Therefore, in the emitter wire w1, a voltage drop based on the constant current Iref and the resistance value Rewire of the joint portion between the emitter of the IGBT 1a and the emitter wire w1 occurs.

In addition, since the non-inverting input terminal (+) of the comparator cmp1 is connected to the emitter wire w1, the voltage Vewire (=Iref×Rewire) generated at this time is input to the non-inverting input terminal (+) of the comparator cmp1. The comparator cmp1 compares the voltage Vewire with the threshold voltage Vth, and if the voltage Vewire is greater than or equal to the threshold voltage Vth, outputs an H-level degradation detection signal s4 indicating that the degradation is progressing.

When the protection alarm signal output circuit 24 receives the overcurrent detection signal s1 or overheat detection signal s2, the protection alarm signal output circuit 24 outputs the alarm signal ALM indicating that the IGBT 1a is in an overcurrent state or in an overheat state to make a notification to the outside that the semiconductor device 1-1 is in the overcurrent state or in the overheat state.

In addition, when the protection alarm signal output circuit 24 receives the overcurrent detection signal s1 or overheat detection signal s2, the protection alarm signal output circuit 24 outputs a drive stop signal s5. When the gate drive circuit 21 receives the drive stop signal s5, the gate drive circuit 21 sets the gate voltage Vge to L level less than the threshold level to turn off the IGBT 1a.

The protection alarm signal output circuit 24 has a degradation notification function. When receiving the H-level degradation detection signal s4 for the leading edge blanking twng or longer, the protection alarm signal output circuit 24 outputs the degradation warning signal WNG indicating that the degradation is progressing in the joint portion between the emitter of the IGBT 1a and the emitter wire w1. For example, the L-level degradation warning signal WNG indicates that the degradation has occurred.

In this connection, an amplification circuit that amplifies the level of the voltage Vewire on the emitter wire w1 may be provided between the terminal a2 of the switch sw1 and the non-inverting input terminal (+) of the comparator cmp1.

This is because, in general, the emitter wire w1 has a resistance component of several mΩ to several tens mΩ, and without increasing the constant current Iref, it may be difficult for the comparator cmp1 to perform the comparison and determination (since the voltage value ranges approximately from several mV to several tens mV, it may be difficult to distinguish from noise).

Therefore, the amplification circuit amplifies the voltage Vewire up to a value that is not affected by noise, and then inputs the amplified voltage to the non-inverting input terminal (+) of the comparator cmp1. This configuration enables the comparator cmp1 to accurately make a determination based on the comparison between the voltage Vewire and the threshold voltage Vth, without the need of supplying a high constant current Iref.

Figure 6:
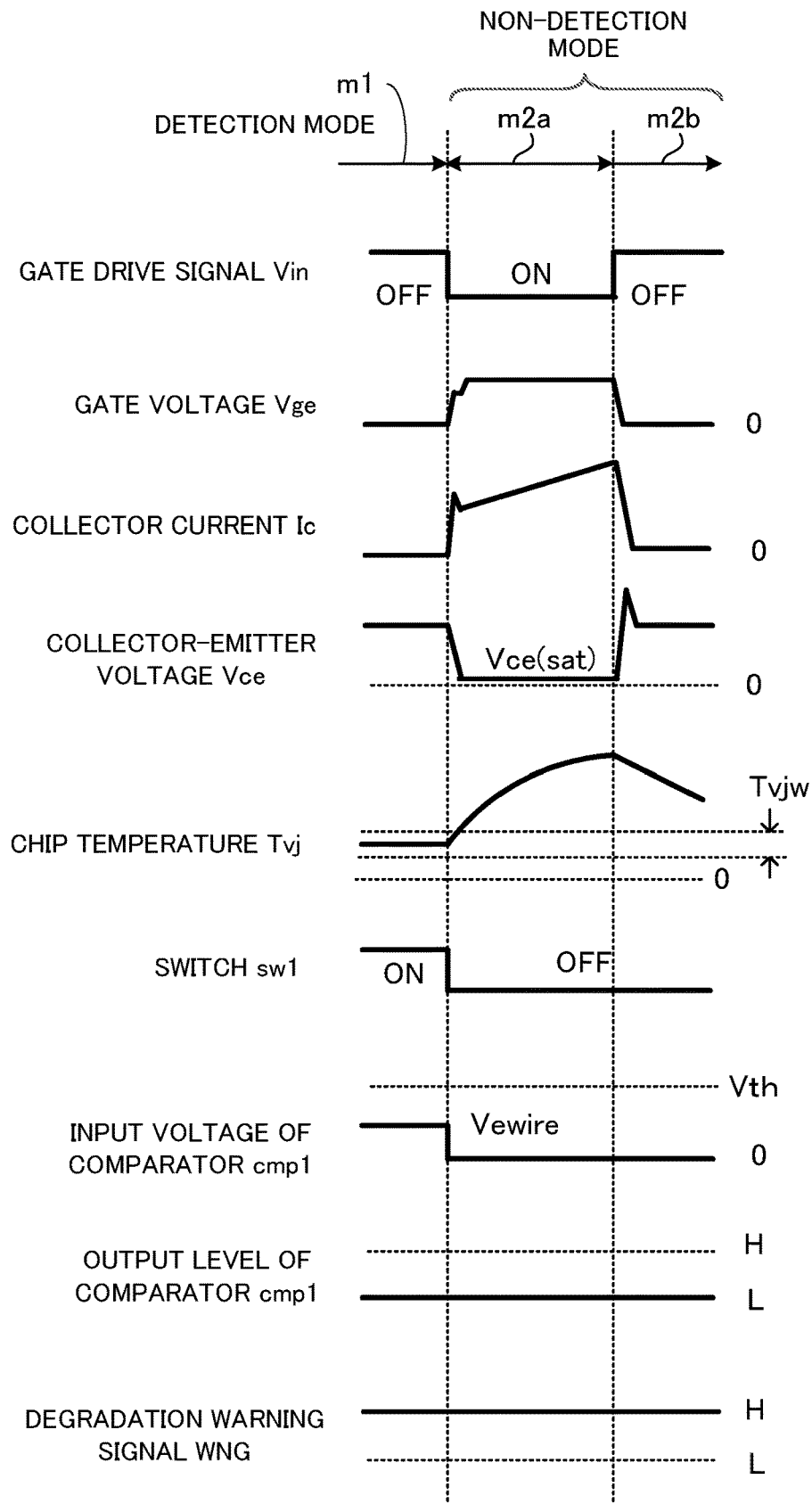
FIG. 6 is a timing chart representing the operation of the semiconductor device.

FIG. 6 is a timing chart representing the operation of the semiconductor device. More specifically, the timing chart represents the operation in the case where degradation is not progressing in the joint portion between the emitter of the IGBT 1a and the emitter wire w1.

(Detection mode m1) As a command to turn off the IGBT 1a, an H-level gate drive signal Vin is input to the control terminal IN2. When receiving the H-level gate drive signal Vin, the gate drive circuit 21 sets the gate voltage Vge to L level less than the threshold level of the IGBT 1a.

Since the gate voltage Vge is L level, the IGBT 1a does not conduct but goes into turn-off state, so that the collector current Ic does not flow. In addition, the collector-emitter voltage Vce is approximately equal to a power supply voltage that is supplied from a battery or the like until the IGBT 1a is turned on.

In the case where the IGBT 1a is in turn-off state, the chip temperature Tvj of the IGBT 1a is within a predetermined temperature range Tvjw (for example, 25±5° C.). Since the IGBT 1a is in turn-off state and the temperature of the IGBT 1a is within the predetermined temperature range Tvjw, the switch sw1 is turned on.

When the switch sw1 is turned on, the output terminal of the constant current source IR1 is connected to the emitter wire w1, so that the constant current Iref flows through the emitter wire w1. Then, a voltage drop based on the constant current Iref and the resistance value Rewire of the joint portion between the emitter of the IGBT 1a and the emitter wire w1 occurs. In addition, the voltage Vewire (=Iref× Rewire) generated at this time is input as an input voltage to the non-inverting input terminal (+) of the comparator cmp1.

Since the voltage Vewire input to the non-inverting input terminal (+) of the comparator cmp1 is less than the threshold voltage Vth, the comparator cmp1 outputs an L-level signal. Since the protection alarm signal output circuit 24 receives the L-level signal from the comparator cmp1, the protection alarm signal output circuit 24 does not output the degradation warning signal WNG but outputs H level from the output terminal OUT2 (the H level indicates a low dangerous level of degradation).

(Non-detection mode m2a) As a command to turn on the IGBT 1a, an L-level gate drive signal Vin is input to the control terminal IN2. When receiving the L-level gate drive signal Vin, the gate drive circuit 21 sets the gate voltage Vge to H level greater than the threshold level of the IGBT 1a.

Since the gate voltage Vge is H level, the IGBT 1a starts conducting, so that the IGBT 1a goes into turn-on state, and the collector current IC starts to flow and increase. In addition, when the IGBT 1a starts conducting, the collector-emitter voltage Vce falls from the power supply voltage supplied from the battery or the like down to a collector-emitter saturation voltage Vce(sat) of the IGBT 1a.

In the case where the IGBT 1a is in turn-on state, the chip temperature Tvj of the IGBT 1a increases and goes out of the predetermined temperature range Tvjw. Since the IGBT 1a is in turn-on state and the temperature of the IGBT 1a is out of the predetermined temperature range Tvjw, the switch sw1 is turned off.

In the case where the switch sw1 is in off state, the output terminal of the constant current source IR1 is disconnected from the emitter wire w1. Therefore, the constant current Iref does not flow to the emitter wire w1. Therefore, a voltage drop based on the constant current Iref and the resistance value Rewire of the joint portion between the emitter of the IGBT 1a and the emitter wire w1 does not occur, so that the input voltage to the non-inverting input terminal (+) of the comparator cmp1 is L level.

Since the input voltage to the non-inverting input terminal (+) of the comparator cmp1 is less than the threshold voltage Vth, the comparator cmp1 outputs an L-level signal. Since the protection alarm signal output circuit 24 receives the L level signal from the comparator cmp1, the protection alarm signal output circuit 24 does not output the degradation warning signal WNG but outputs H level from the output terminal OUT2.

(Non-detection mode m2b) As a command to turn off the IGBT 1a, an H-level gate drive signal Vin is input to the control terminal IN2, and the gate drive circuit 21 sets the gate voltage Vge to L level.

Since the gate voltage Vge is L level, the IGBT 1a switches from turn-on state to turn-off state, so that the collector current Ic drops. In addition, since the IGBT 1a switches to turn-off state, the collector-emitter voltage Vce starts to increase from the collector-emitter saturation voltage Vce(sat) up to the power supply voltage supplied from the battery or the like.

Since the IGBT 1a switches from turn-on state to turn-off state, the chip temperature Tvj of the IGBT 1a falls. Assume now that the chip temperature Tvj falls but does not fall within the predetermined temperature range Tvjw. Since the IGBT 1a is in turn-off state but the temperature of the IGBT 1a is out of the predetermined temperature range Tvjw, the switch sw1 remains in its off state.

In the case where the switch sw1 is in off state, the output terminal of the constant current source IR1 is disconnected from the emitter wire w1, so that the constant current Iref does not flow to the emitter wire w1. Therefore, a voltage drop based on the constant current Iref and the resistance value Rewire of the joint portion between the emitter of the IGBT 1a and the emitter wire w1 does not occur, so that the input voltage to the non-inverting input terminal (+) of the comparator cmp1 is L level.

Since the input voltage to the non-inverting input terminal (+) of the comparator cmp1 is less than the threshold voltage Vth, the comparator cmp1 outputs an L-level signal. Since the protection alarm signal output circuit 24 receives the L level signal from the comparator cmp1, the protection alarm signal output circuit 24 does not output the degradation warning signal WNG but outputs H level from the output terminal OUT2.

Figure 7:
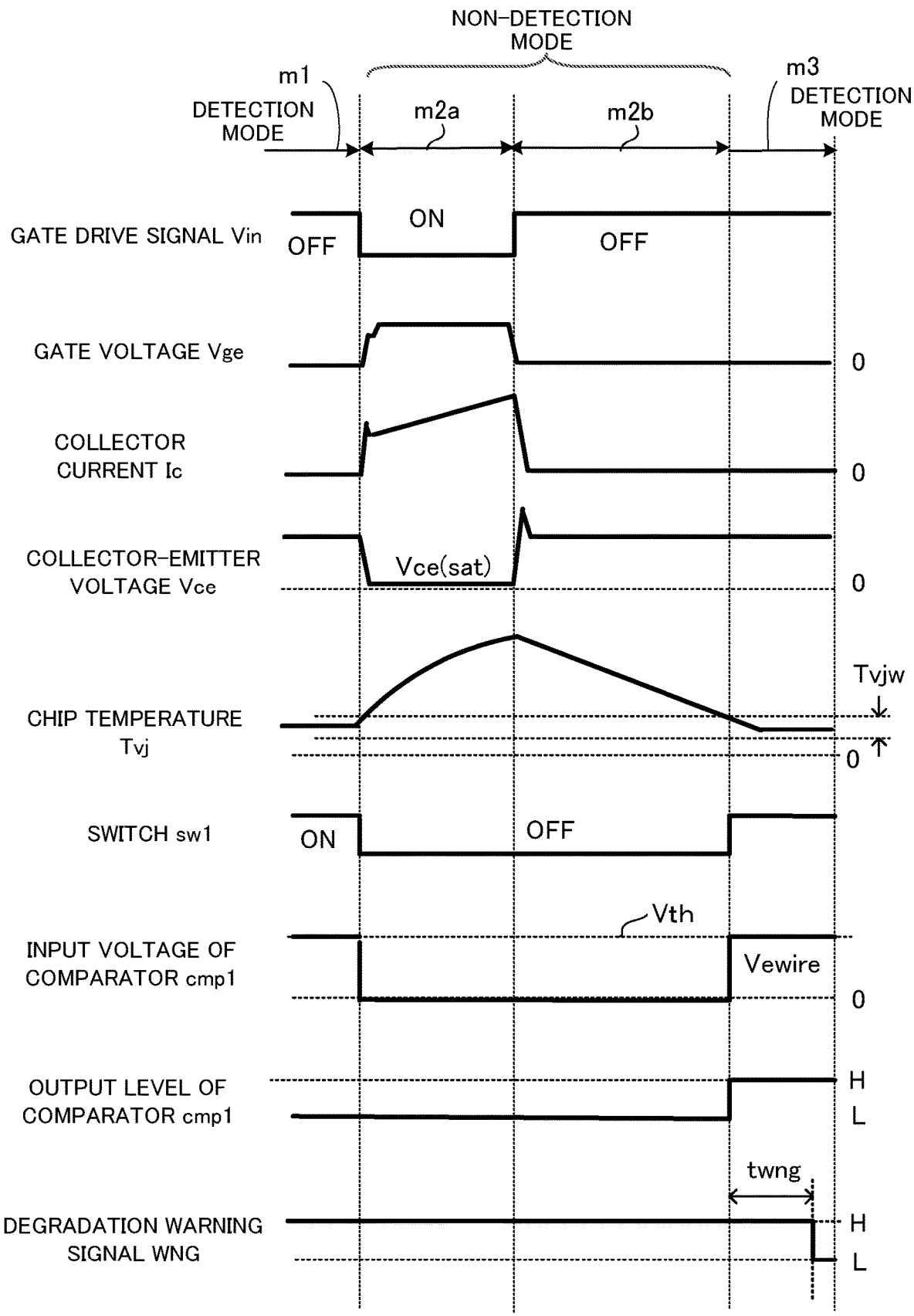
FIG. 7 is a timing chart representing the operation of the semiconductor device.

FIG. 7 is a timing chart representing the operation of the semiconductor device. More specifically, the timing chart represents the operation in the case where degradation is progressing in the joint portion between the emitter of the IGBT 1a and the emitter wire w1. Note that the detection mode m1 and the non-detection modes m2a and m2b are the same as those illustrated in FIG. 6. Therefore, the following describes a detection mode m3 in which a degradation detection is actually performed.

(Detection mode m3) As a command to turn off the IGBT 1a, an H-level gate drive signal Vin is input to the control terminal IN2. Since the gate drive circuit 21 receives the H-level gate drive signal Vin, the gate drive circuit 21 sets the gate voltage Vge to L level.

Since the gate voltage Vge is L level, the IGBT 1a does not conduct but goes into turn-off state, so that the collector current Ic does not flow. In addition, the collector-emitter voltage Vce remains at a value that is approximately equal to the power supply voltage supplied form the battery or the like until the IGBT 1a is turned on.

Since the IGBT 1a has switched from turn-on state to turn-off state, the chip temperature Tvj of the IGBT 1a falls. Assume now that the chip temperature Tvj of the IGBT 1a falls within the predetermined temperature range Tvjw. Since the IGBT 1a is in turn-off state and the temperature of the IGBT 1a is within the predetermined temperature range Tvjw, the switch sw1 is turned on.

When the switch sw1 is turned on, the output terminal of the constant current source IR1 becomes connected to the emitter wire w1, so that the constant current Iref flows through the emitter wire w1. Then, a voltage drop based on the constant current Iref and the resistance value Rewire of the joint portion between the emitter of the IGBT 1a and the wire w1 occurs. In addition, the voltage Vewire (=Iref× Rewire) generated at this time is input to the non-inverting input terminal (+) of the comparator cmp1.

Since the voltage Vewire input to the non-inverting input terminal (+) of the comparator cmp1 is greater than or equal to the threshold voltage Vth, the comparator cmp1 outputs an H-level degradation detection signal s4. When the protection alarm signal output circuit 24 detects that the comparator cmp1 has output the H-level degradation detection signal s4 for the leading edge blanking twng or longer, the protection alarm signal output circuit 24 outputs the L-level degradation warning signal WNG from the output terminal OUT2 to make a notification to the outside that there is a high dangerous level of degradation.

As described above, in the situation where the conditions are satisfied, in which the IGBT 1a is in turn-off state and the temperature of the IGBT 1a is within the predetermined temperature range, the semiconductor device 1-1 supplies the constant current Iref to the emitter wire w1, and monitors temporal changes of the voltage on the emitter wire w1 to detect degradation.

Here, the collector current flows while the IGBT 1a is in turn-on state. The collector current is a function of time, and the value of the collector current varies with time, which causes the current flowing through the emitter wire w1 to vary accordingly. In addition, the emitter wire w1 is usually an aluminum wire, which has a positive temperature coefficient. Therefore, the resistance value of the emitter wire w1 also varies with changes in temperature.

In view of the above, in the present embodiment, in the situation where the conditions are satisfied, in which the IGBT 1a is in turn-off state and the temperature of the IGBT 1a is within the predetermined temperature range, the constant current Iref is supplied to the emitter wire w1 to perform the degradation detection as described above. This approach makes it possible to accurately detect degradation while preventing the resistance value of the joint portion between the IGBT 1a and the emitter wire w1 from varying due to factors other than the degradation, and thus provides an effect of improving the accuracy of the degradation detection.

Figure 8:
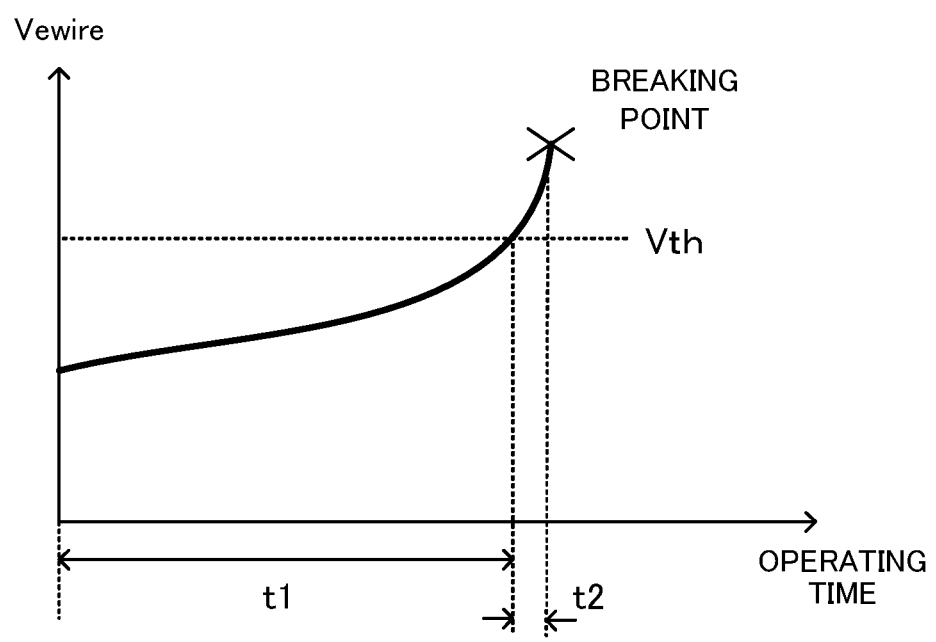
FIG. 8 illustrates temporal changes of a voltage that occur with an increase in the resistance value of an emitter wire.

FIG. 8 illustrates temporal changes of a voltage that occur with an increase in the resistance value of an emitter wire. The horizontal axis represents the operating time of the IGBT 1a, whereas the vertical axis represents the voltage Vewire that varies with an increase in the resistance value of the emitter wire w1.

(Operating time period t1) The voltage Vewire (Iref× Rewire) is less than the threshold voltage Vth of the comparator cmp1. Therefore, it is determined that degradation in the joint portion between the emitter of the IGBT 1a and the emitter wire w1 has not progressed to a dangerous level at which a failure would occur, and therefore the degradation warning signal WNG is not output.

(Operating time period t2) The voltage Vewire becomes greater than or equal to the threshold voltage Vth of the comparator cmp1. Therefore, it is determined that degradation in the joint portion between the emitter of the IGBT 1a and the emitter wire w1 has progressed to the dangerous level at which a failure would occur, and therefore the degradation warning signal WNG is output. Since the degradation warning signal WNG is output before the semiconductor device fails (before the breaking point), it makes it possible to recognize an appropriate time when the IGBT 1a and its peripheral components need replacing.

Figure 9:
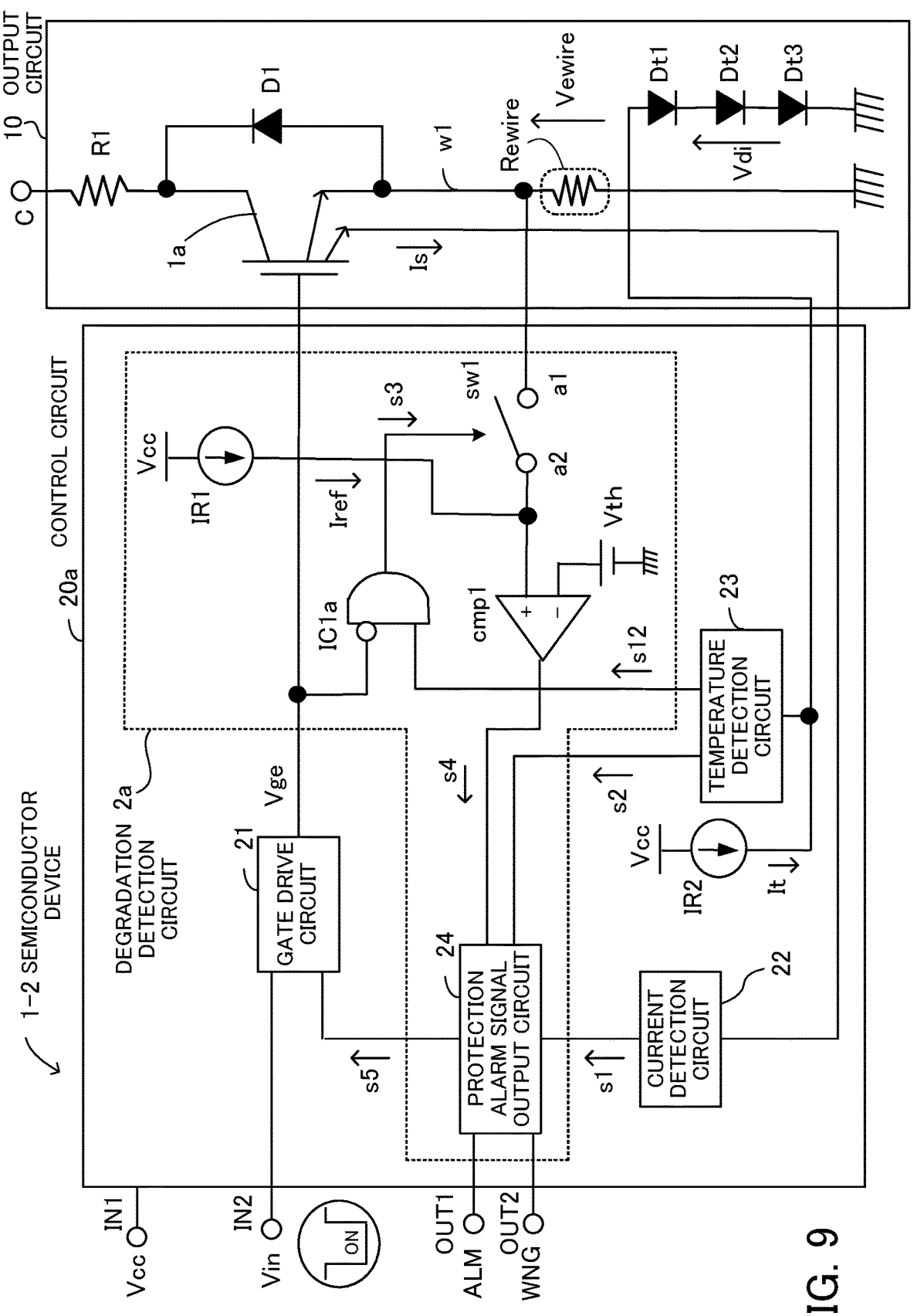
FIG. 9 illustrates an example of the configuration of a semiconductor device.
Figure 10:
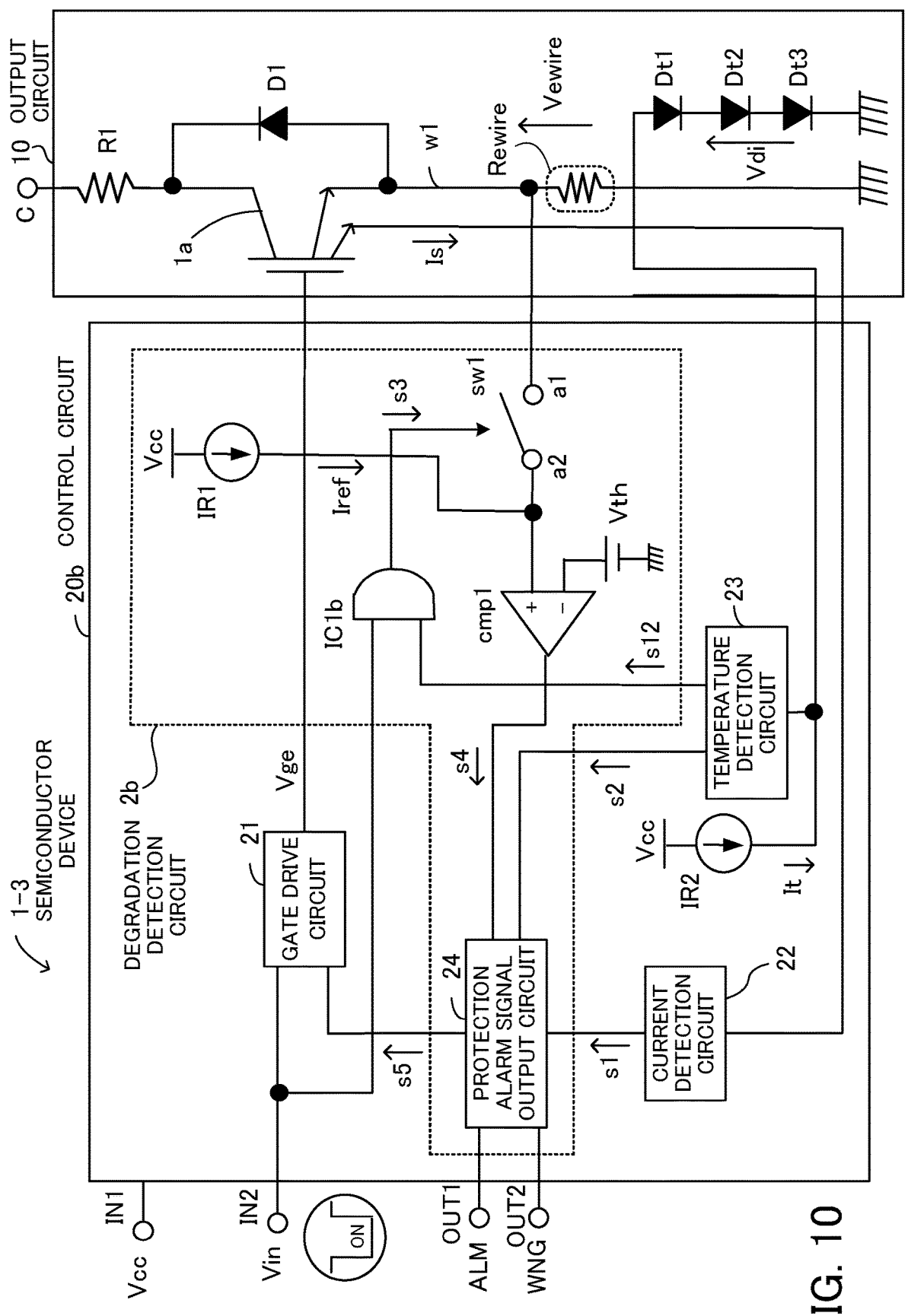
FIG. 10 illustrates an example of the configuration of a semiconductor device.
Figure 11:
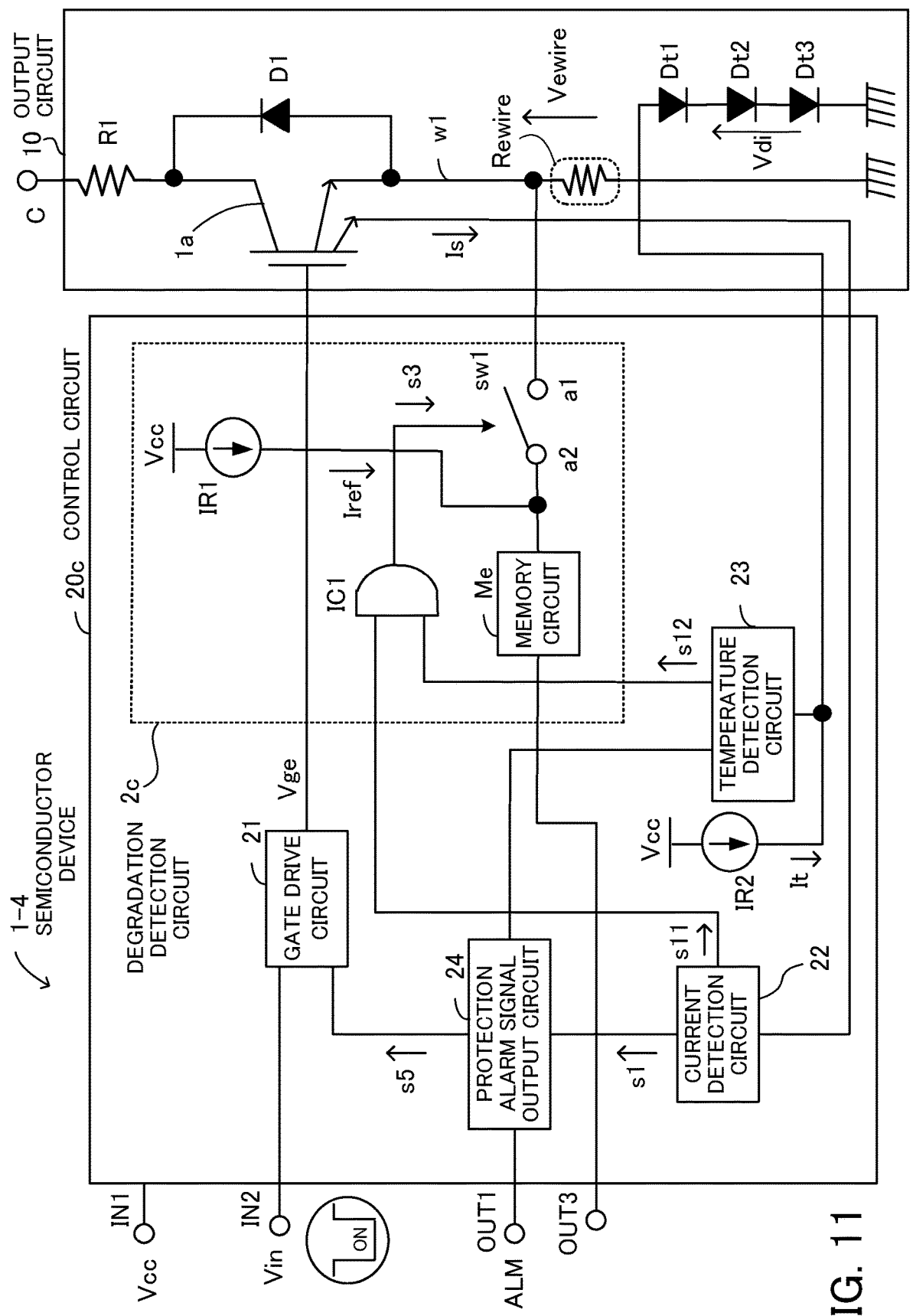
FIG. 11 illustrates an example of the configuration of a semiconductor device.

The following describes modification examples of the semiconductor device 1-1 with reference to FIGS. 9 to 11. FIG. 9 illustrates an example of the configuration of a semiconductor device. The semiconductor device 1-2 includes an output circuit 10 and a control circuit 20a.

The control circuit 20a includes a degradation detection circuit 2a, a gate drive circuit 21, a current detection circuit 22, a temperature detection circuit 23, and a temperature detection-dedicated constant current source IR2. In addition, the degradation detection circuit 2a includes a constant current source IR1, a logic circuit IC1a, a switch sw1, a comparator cmp1, and a protection alarm signal output circuit 24.

In the degradation detection circuit 2a, one input terminal (negative logic input terminal) of the logic circuit IC1a is connected to the output terminal of the gate drive circuit 21, and the other input terminal of the logic circuit IC1a is connected to the output terminal of the temperature detection circuit 23 that outputs a normal temperature detection signal s12. The other configuration is the same as that illustrated in FIG. 5.

Here, when receiving an L-level gate voltage Vge less than the threshold level of the IGBT 1a from the gate drive circuit 21 and the H-level normal temperature detection signal s12 from the temperature detection circuit 23, the logic circuit IC1a outputs an H-level signal (a signal of a predetermined level) s3 to turn on the switch sw1.

As described above, the semiconductor device 1-2 detects that the IGBT 1a is in turn-off state, by using the level of the gate voltage Vge instead of using the current non-detection signal S11 output from the current detection circuit 22. Note that it is determined using the normal temperature detection signal s12 output from the temperature detection circuit 23 that the temperature of the IGBT 1a is within the predetermined temperature range, as in FIG. 5.

FIG. 10 illustrates an example of the configuration of a semiconductor device. The semiconductor device 1-3 includes an output circuit 10 and a control circuit 20b. The control circuit 20b includes a degradation detection circuit 2b, a gate drive circuit 21, a current detection circuit 22, a temperature detection circuit 23, and a temperature detection-dedicated constant current source IR2. In addition, the degradation detection circuit 2b includes a constant current source IR1, a logic circuit IC1b, a switch sw1, a comparator cmp1, and a protection alarm signal output circuit 24.

In the degradation detection circuit 2b, one input terminal of the logic circuit IC1b is connected to the control terminal IN2 (an input terminal of the gate drive circuit 21), and the other input terminal of the logic circuit IC1b is connected to the output terminal of the temperature detection circuit 23 that outputs a normal temperature detection signal s12. The other configuration is the same as that illustrated in FIG. 5.

Here, when the logic circuit IC1b does not receive a gate drive signal Vin that is input to the control terminal IN2 (H level being input to the control terminal IN2) but receives the H-level normal temperature detection signal s12 output from the temperature detection circuit 23, the logic circuit IC1b outputs an H-level signal (a signal of a predetermined level) s3 to turn on the switch sw1.

As described above, the semiconductor device 1-3 detects that the IGBT 1a is in turn-off state, by using the gate drive signal Vin instead of using the current non-detection signal s11 output from the current detection circuit 22. Note that it is determined using the normal temperature detection signal s12 output from the temperature detection circuit 23 that the temperature of the IGBT 1a is within the predetermined temperature range, as in FIG. 5.

FIG. 11 illustrates an example of the configuration of a semiconductor device. The semiconductor device 1-4 includes an output circuit 10 and a control circuit 20c. The control circuit 20c includes a degradation detection circuit 2c, a gate drive circuit 21, a current detection circuit 22, a temperature detection circuit 23, a temperature detection-dedicated constant current source IR2, and a protection alarm signal output circuit 24. In addition, the degradation detection circuit 2c includes a constant current source IR1, a logic circuit Id1, a switch sw1, a comparator cmp1, and a memory circuit Me.

In the degradation detection circuit 2c, the input terminal of the memory circuit Me is connected to the output terminal of the constant current source IR1 and a terminal a2 of the switch sw1. The output terminal of the memory circuit Me is connected to an output terminal OUT3.

Here, the memory circuit Me holds a digital value obtained by converting the level of a voltage Vewire input via the switch sw1, and outputs an information signal of this digital value from the output terminal OUT3. In this way, the semiconductor device 1-4 stores information indicating the digital value of the voltage Vewire in the memory circuit Me, and outputs the information signal of the digital value to the outside via the output terminal OUT3.

With this approach, a user is notified of the digital value visualizing a degradation state. Therefore, using the digital value, the user is able to flexibly deal with the operation and maintenance of the semiconductor device 1-4.

Figure 12:
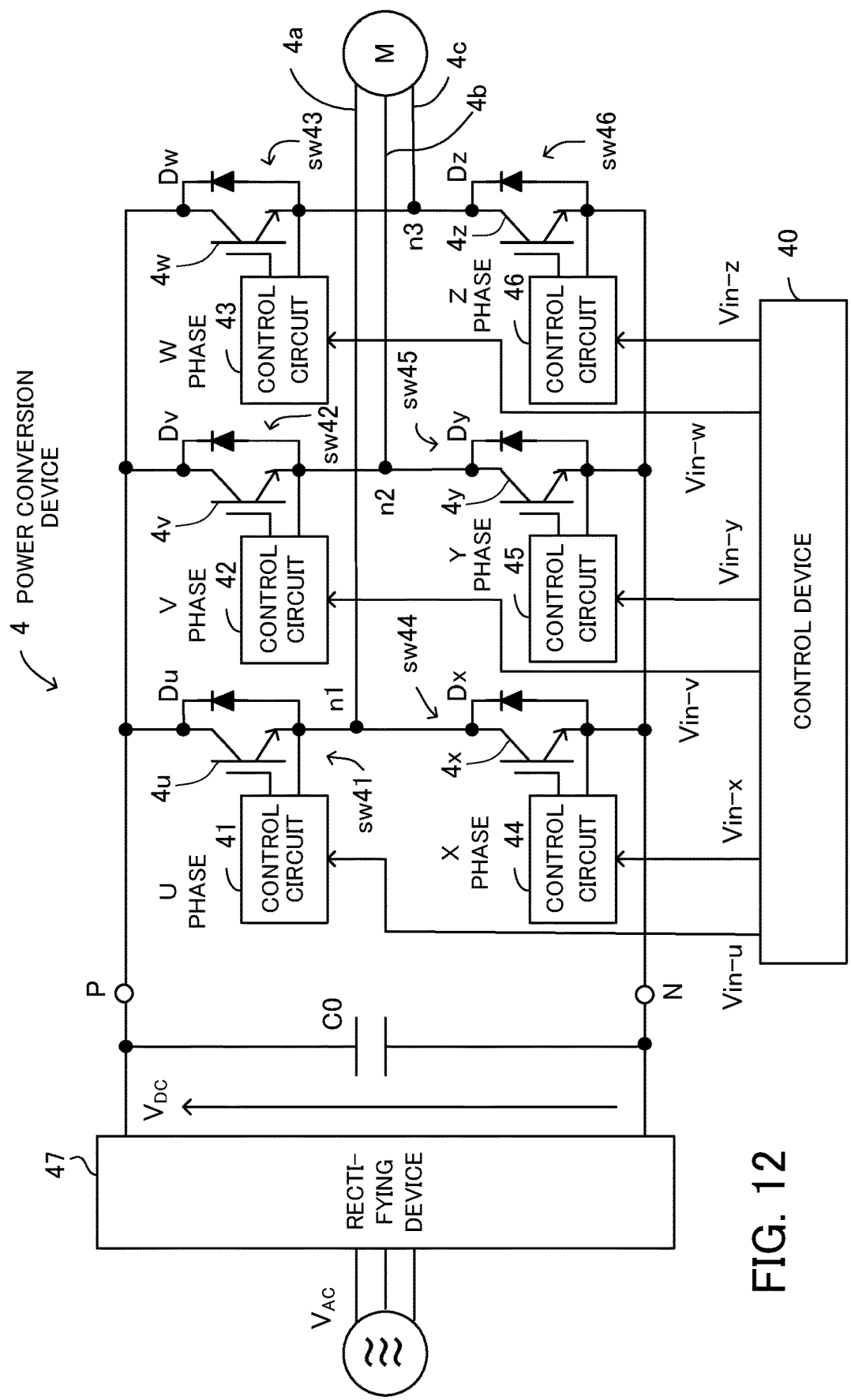
FIG. 12 illustrates an example of a power conversion device.
Figure 13:
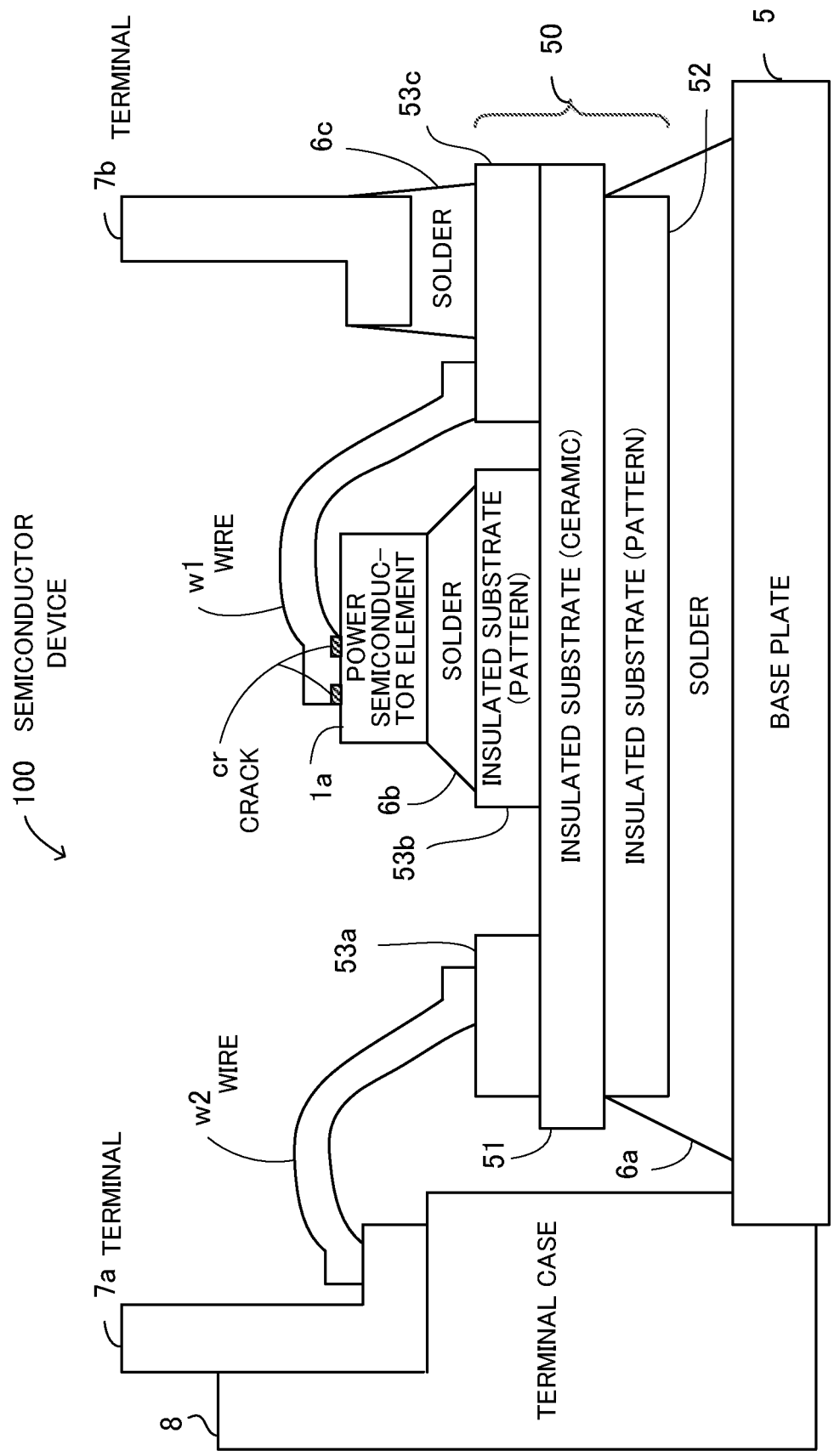
FIG. 13 illustrates an example of a cross-sectional structure of a semiconductor device.

The following describes a power conversion device to which the semiconductor device of the present embodiment is applied. FIG. 12 illustrates an example of the configuration of the power conversion device. The power conversion device 4 includes switch elements sw41, sw42, and sw43 respectively arranged for a U phase, a V phase, and a W phase on the upper arm side, and switch elements sw44, sw45, and sw46 respectively arranged for an X phase, a Y phase, and a Z phase on the lower arm side.

In addition, the power conversion device 4 includes an alternating current power supply $V_{AC}$, a rectifying device 47, a smoothing capacitor C0, a control device 40, and a load M. The rectifying device 47 converts an alternating current voltage output from the alternating current power supply $V_{AC}$ to a direct current voltage $V_{DC}$.

On the other hand, power is supplied to the load M through a wire 4a connecting to a node n1 that is a connection point between the switch element sw4*l* and the switch element sw44, a wire 4*b* connecting to a node n2 that is a connection point between the switch element sw42 and the switch element sw45, and a wire 4*c* connecting to a node n3 that is a connection point between the switch element sw43 and the switch element sw46.

The U-phase switch element sw41 includes an IGBT 4*u* and a diode Du, the V-phase switch element sw42 includes an IGBT 4*v* and a diode Dv, and the W-phase switch element sw43 includes an IGBT 4*w* and a diode Dw.

The X-phase switch element sw44 include an IGBT 4*x* and a diode Dx, the Y-phase switch element sw45 includes an IGBT 4*y* and a diode Dy, and the Z-phase switch sw46 includes an IGBT 4*z* and a diode Dz.

In addition, control circuits 41, 42, and 43 that perform drive control and others are provided respectively for the switch elements sw41, sw42, and sw43, and control circuits 44, 45, and 46 that perform drive control and others are provided respectively for the switch elements sw44, sw45, and sw46. In addition, the control device 40 that collectively controls the control circuits 41 to 46 is provided. In this connection, the control circuits 41 to 46 have any function of the control circuits 20, 20*a*, 20*b*, and 20*c* described above with reference to FIGS. 5 and 9 to 11.

In the connection relationship among the structural elements, the positive electrode terminal of the rectifying device 47 is connected to one terminal of the smoothing capacitor C0, the collector of the IGBT 4*u*, the cathode of the diode Du, the collector of the IGBT 4*v*, the cathode of the diode Dv, the collector of the IGBT 4*w*, and the cathode of the diode Dw.

The negative electrode terminal of the rectifying device 47 is connected to the other terminal of the smoothing capacitor C0, the emitter of the IGBT 4*x*, the anode of the diode Dx, the emitter of the IGBT 4*y*, the anode of the diode Dy, the emitter of the IGBT 4*z*, and the anode of the diode Dz.

The gate of the IGBT 4*u* is connected to the control circuit 41, and the anode of the diode Du is connected to the emitter of the IGBT 4*u*, the control circuit 41, and the node n1. The node n1 is connected to the load M, the collector of the IGBT 4*x*, and the cathode of the diode Dx.

The gate of the IGBT 4*v* is connected to the control circuit 42, and the anode of the diode Dv is connected to the emitter of the IGBT 4*v*, the control circuit 42, and the node n2. The node n2 is connected to the load M, the collector of the IGBT 4*y*, and the cathode of the diode Dy.

The gate of the IGBT 4*w* is connected to the control circuit 43, and the anode of the diode Dw is connected to the emitter of the IGBT 4*w*, the control circuit 43, and the node n3. The node n3 is connected to the load M, the collector of the IGBT 4*z*, and the cathode of the diode Dz.

Note that the control device 40 inputs a gate drive signal Vin-u to the control circuit 41, a gate drive signal Vin-v to the control circuit 42, and a gate drive signal Vin-w to the control circuit 43. Similarly, the control device 40 inputs a gate drive signal Vin-x to the control circuit 44, a gate drive signal Vin-y to the control circuit 45, and a gate drive signal Vin-z to the control circuit 46.

As described above, in the present embodiment, in the situation where the power semiconductor element is in turn-off state and the temperature of the power semiconductor element is within the predetermined temperature range, a constant current is made to flow to the wire in order to determine a degradation state. This configuration makes it possible to detect degradation in the joint portion between the power semiconductor element and the wire more accurately, and thus to prevent a failure from occurring.

Heretofore, the embodiment has been described. Each component in the embodiment may be replaced with another component having an equivalent function. In addition, other desired configurations and steps may be added. Furthermore, two or more desired configurations (features) in the embodiment described above may be combined.

According to one aspect, it is possible to detect degradation in the joint portion between a power semiconductor element and a wire and thus to prevent a failure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a power semiconductor element having a current output electrode;
    a wire bonded to the current output electrode;
    a current detection circuit connected to the power semiconductor element, the current detection circuit having an output terminal that outputs a current non-detection signal while no current flows through the power semiconductor element;
    a temperature detection circuit having an output terminal that outputs a normal temperature detection signal while a temperature of the power semiconductor element is within a predetermined temperature range; and
    a degradation detection circuit, including a logic circuit having two input terminals, respectively connected to the output terminal of the current detection circuit and the output terminal of the temperature detection circuit, the logic circuit being configured to determine satisfaction of a plurality of conditions, including
        that the power semiconductor element is in a turn-off state, and
        that the temperature of the power semiconductor element is within the predetermined temperature range,
    upon receiving the current non-detection signal and the normal temperature detection signal, so that the degradation detection circuit monitors a temporal change of a voltage value of the wire while a constant current flows through the wire, responsive to the satisfaction of the plurality of conditions.

2. The semiconductor device according to claim 1, wherein the degradation detection circuit further incudes:
    a switch circuit,
    a constant current source having an output terminal that outputs the constant current,
    a voltage change monitoring circuit having an input terminal, and
    a degradation notification circuit.

3. The semiconductor device according to claim 2, wherein
    the logic circuit outputs a signal of a predetermined level responsive to the satisfaction of the plurality of conditions;

the switch circuit connects the output terminal of the constant current source to the current output electrode upon receiving the signal of the predetermined level, so as to supply the constant current to the wire and to connect the wire to the input terminal of the voltage change monitoring circuit;

the voltage change monitoring circuit compares the voltage value of the wire with a threshold voltage value, and outputs a degradation detection signal upon determining that the voltage value of the wire is greater than or equal to the threshold voltage value; and the degradation notification circuit outputs a degradation warning signal upon receiving the degradation detection signal for a predetermined period of time or longer.

4. The semiconductor device according to claim 3, further comprising an amplification circuit that amplifies a level of the voltage value on the wire.

5. The semiconductor device according to claim 1, wherein the degradation detection circuit further includes
a switch circuit,
a constant current source having an output terminal that outputs the constant current, and
a memory circuit having an input terminal.

6. The semiconductor device according to claim 5, wherein
the logic circuit outputs a signal of a predetermined level responsive to the satisfaction of the plurality of conditions,
the switch circuit is turned on upon receiving the signal of the predetermined level, so as to connect the output terminal of the constant current source to the wire, to thereby supply the constant current to the wire and to connect the wire to the input terminal of the memory circuit, and
the memory circuit holds a level of the voltage value on the wire in a form of a digital value, and outputs an information signal of the digital value.

7. A semiconductor device, comprising:
a power semiconductor element having a current output electrode and a gate;
a wire bonded to the current output electrode;
a drive circuit having an output terminal, the drive circuit generating a gate voltage value for driving the power semiconductor element and outputting the gate voltage value via the output terminal thereof to the gate of the power semiconductor element;
a temperature detection circuit having an output terminal that outputs a normal temperature detection signal while a temperature of the power semiconductor element is within a predetermined temperature range; and
a degradation detection circuit, including a logic circuit having two input terminals, respectively connected to the output terminal of the drive circuit and the output terminal of the temperature detection circuit, the logic circuit determining satisfaction of a plurality of conditions, including
that the power semiconductor element is in a turn-off state, and
that the temperature of the power semiconductor element is within the predetermined temperature range,
responsive to the gate voltage value being less than a threshold level of the power semiconductor element and upon receiving the normal temperature detection signal, so that the degradation detection circuit monitors a temporal change of a voltage value of the wire while a constant current flows through the wire, responsive to the satisfaction of the plurality of conditions.

8. A semiconductor device, comprising:
a power semiconductor element having a current output electrode;
a wire bonded to the current output electrode;
a control terminal for receiving a gate drive signal for driving the power semiconductor element;
a temperature detection circuit having an output terminal that outputs a normal temperature detection signal while a temperature of the power semiconductor element is within a predetermined temperature range; and
a degradation detection circuit, including a logic circuit having two input terminals, respectively connected to the control terminal, and to the output terminal of the temperature detection circuit, the logic circuit determining satisfaction of a plurality of conditions, including
that the power semiconductor element is in a turn-off state, and
that the temperature of the power semiconductor element is within the predetermined temperature range,
upon receiving the normal temperature detection signal without receiving the gate drive signal, so that the degradation detection circuit monitors a temporal change of a voltage value of the wire while a constant current flows through the wire, responsive to the satisfaction of the plurality of conditions.

\* \* \* \* \*